(12) United States Patent
Yang et al.

(10) Patent No.: US 6,184,147 B1
(45) Date of Patent: Feb. 6, 2001

(54) METHOD FOR FORMING A HIGH ASPECT RATIO BORDERLESS CONTACT HOLE

(75) Inventors: Chan-Lon Yang, Taipei; Tong-Yu Chen; Keh-Ching Huang, both of Hsinchu, all of (TW)

(73) Assignee: United Microelectronics Corp. (TW)

( * ) Notice: Under 35 U.S.C. 154(b), the term of this patent shall be extended for 0 days.

(21) Appl. No.: 09/263,421

(22) Filed: Mar. 5, 1999

(51) Int. Cl.$^7$ .................................................. H01L 21/302
(52) U.S. Cl. .......................... 438/714; 438/715; 438/716; 438/723; 438/724; 438/738; 438/743; 438/744
(58) Field of Search .................................... 438/700–703, 438/706, 707, 710, 711, 714–716, 723–724, 733, 735, 738, 743, 744; 216/67–81

(56) References Cited

U.S. PATENT DOCUMENTS

| | | | |
|---|---|---|---|
| 5,595,627 | * | 1/1997 | Inazawa et al. ................... 156/643.1 |
| 5,817,579 | * | 10/1998 | Ko et al. ............................... 438/740 |
| 5,948,701 | * | 9/1999 | Chooi et al. ........................... 438/694 |

\* cited by examiner

Primary Examiner—John F. Niebling
Assistant Examiner—Ha Tran Nguyen
(74) Attorney, Agent, or Firm—Blakely Sokoloff Taylor & Zafman

(57) ABSTRACT

A method for forming a high aspect ration (HAR>4:1) borderless contact hole is described. The method forms a contact/via hole in the silicon oxide layer by performing an etching process with an etchant, $C_4F_8/C_2F_6/Ar/CO$ or $C_4F_8/Ar/CO$, on an etcher. The etcher includes a ring, a roof, a chiller and a chamber. The etchant used in the etching process is controlled under conditions including a $C_4F_8$ flow of about 10 to 20 sccm, a CO flow of about 1 to 100 sccm, and an Ar flow of about 100 to 500 sccm. The flow of $C_2F_6$ is about 0.5 to 1.5 times that of $C_4F_8$. The conditions of the etcher include a roof temperature of about 150 to 300° C., a chiller temperature of about −20 to 20° C., a wall temperature of about 150 to 400° C., a ring temperature of about 150 to 400° C., and a pressure within the chamber of about 4 to 50 mtorr. By controlling the chamber pressure and the deposition rate of the polymer molecules, a properly profiled contact hole is obtained.

6 Claims, 5 Drawing Sheets

METHOD FOR FORMING A HIGH ASPECT RATIO BORDERLESS CONTACT HOLE

BACKGROUND OF THE INVENTION

1. Field of the Invention

This invention relates to a semiconductor fabrication process, and more particularly, to a method for forming a high aspect ratio (HAR) borderless contact hole.

2. Description of Related Art

In order to achieve higher integration of a semiconductor device, a borderless contact process has been implemented in the most current semiconductor fabrication processes. For E-DRAM applications, high aspect ration structure becomes inevitable. Even though the borderless contact process is able to efficiently downsize a semiconductor device to increase the integration, problems, such as how to effectively control the etching process with a properly selected etching end point and etchant, still need to be resolved.

A currently used borderless contact process is schematically illustrated in FIGS. 1A through 1C.

Referring to FIG. 1A, a silicon nitride layer 14 is formed on a substrate 10 to cover preformed devices including an isolation structure 11, a gate 12 and source/drain regions 13 of a metal-oxide-semiconductor (MOS) transistor. The silicon nitride layer 14 serves as an etching end point, and provides protection to the isolation structure 11 in the follow-up etching process. A silicon oxide layer 15 is then formed on the silicon nitride layer 14.

Referring next to FIG. 1B, an etching process 17 is performed on the silicon oxide layer 15 to form an opening 16 that exposes a portion of the silicon nitride layer 14, which is the etching end point. Then, by removing the exposed silicon nitride layer 14 within the opening 16, a contact hole 16a that exposes a portion of the source/drain regions 13 is finished, as shown in FIG. 1C.

Because the oxide-to-nitride selectivity is the most critical parameter for the foregoing etching process, the profile of the contact hole 16a directly relates to the oxide-to-nitride selectivity of the selected etchant. Once an etchant with an improper oxide-to-nitride selectivity is used in the foregoing process, a problem, either over-etching the silicon nitride layer 14 as shown in FIG. 2A, or an abnormal termination of the etching process as shown in FIG. 2B, further causes electrical malfunction. When an etching process is performed on the silicon oxide layer 15 to form an opening 17, the etching process is terminated as soon as the silicon nitride 14 is exposed. However, with an improperly selected etchant, a defective opening 17, as shown in either FIG. 2A or 2B, is obtained. A tapered profile opening 19 as shown in FIG. 2C is also a possible defective opening caused by a improperly selected etchant.

As shown in FIG. 2D, because polymer molecules generated by the etchant normally tend to deposit on the silicon oxide near the corners of the opening 20, which further abnormally affects the isotropy of the performed etching process so that a bowed profile opening 20 is obtained. Since in the fabrication process of a highly integrated semiconductor device, a vertical profile, which has lateral walls forming angles of nearly 90 degrees to the surface of the substrate, is required to meet the desired design rule, a bowed profile opening 20 is definitely unable to meet the requirement.

An etching process that uses an etchant with a low oxide-to-nitride selectivity normally leads to either an over-etched as shown in FIGS. 2A and 2C. On the other hand, an etchant with a high oxide-to-nitride selectivity tends to cause a bowed profile opening shown in FIG. 2D and an under etch opening as shown in FIG. 2B. Therefore, conventionally, a high aspect ration borderless contact process can only concentrate on either one of the options, a vertical profile or a better control of the etching end point, accordingly to the actual needs.

SUMMARY OF THE INVENTION

The method of the invention forms a contact/via hole in the silicon oxide layer by performing an etching process with an etchant, $C_4F_8/C_2F_6/Ar/CO$ or $C_4F_8/Ar/CO$, on an etcher. The etcher contains a ring, a roof, a chiller and a chamber. The etchant used in the etching process is controlled under conditions including a $C_4F_8$ flow of about 10 to 20 sccm, a CO flow of about 1 to 100 sccm, and an Ar flow of about 100 to 500 sccm. The flow of $C_2F_6$ is about 0.5 to 1.5 times that of $C_4F_8$.

In the mean time, the conditions of the etcher include a roof temperature of about 150 to 300° C., a chiller temperature of about −20 to 20° C., a wall temperature of about 150 to 400° C., a ring temperature of about 150 to 400° C., and a pressure within the chamber of about 4 to 50 mtorr. By controlling the chamber pressure and the deposition rate of the polymer molecules, a properly profiled contact hole is obtained.

The present invention forms a vertical-profile HAR (>4:1) borderless contact hole by using an etchant with a high oxide-to-nitride selectivity without causing over-etching or under-etching.

The present invention provides a method for forming a HAR (>4:1) borderless contact hole to overcome the over-etching and under-etching problems, while also providing a better control of the contact hole profile.

According to the method of the invention the opening with vertical profile of nearly 90 degrees (>89 degrees) can be achieved without sacrificing the oxide to nitride selectivity.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
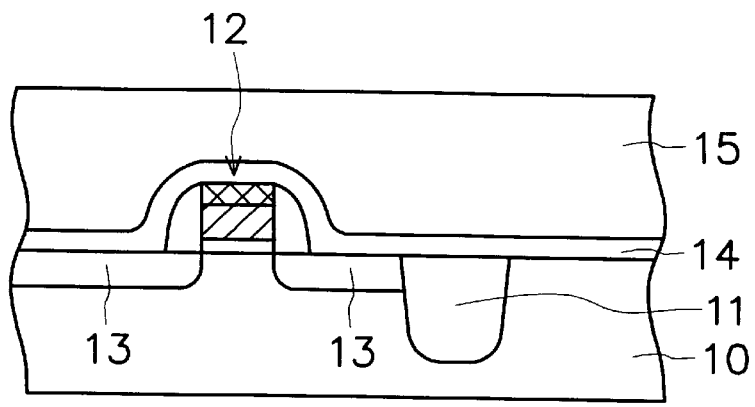
FIGS. 1A through 1C are schematic, cross-sectional views showing a conventional method for forming a HAR borderless contact hole.
Figure 1B:
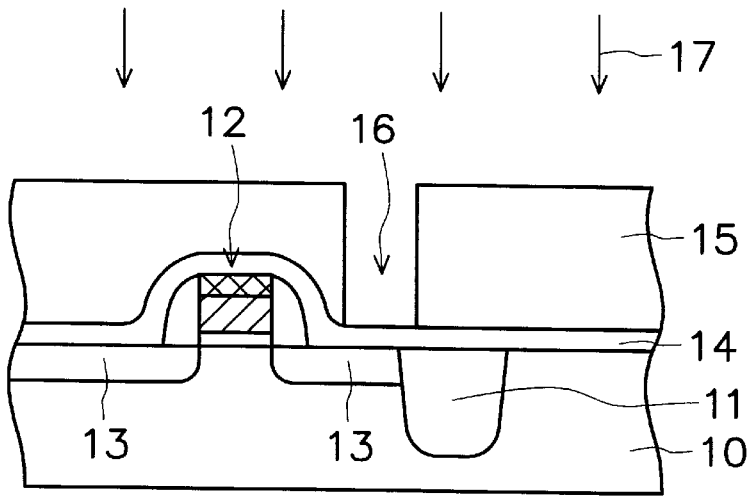
Figure 1C:
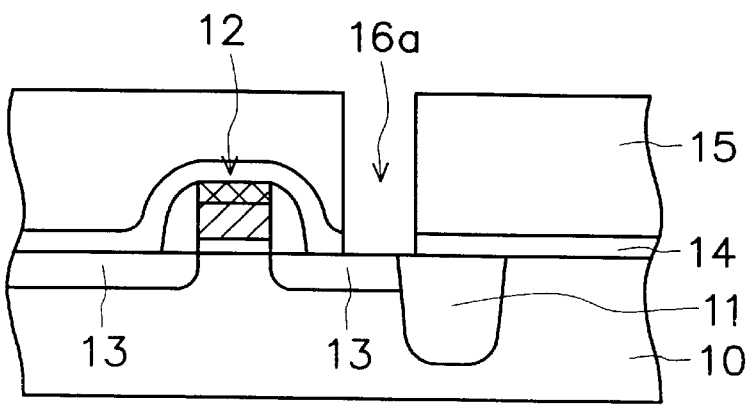
Figure 2A:
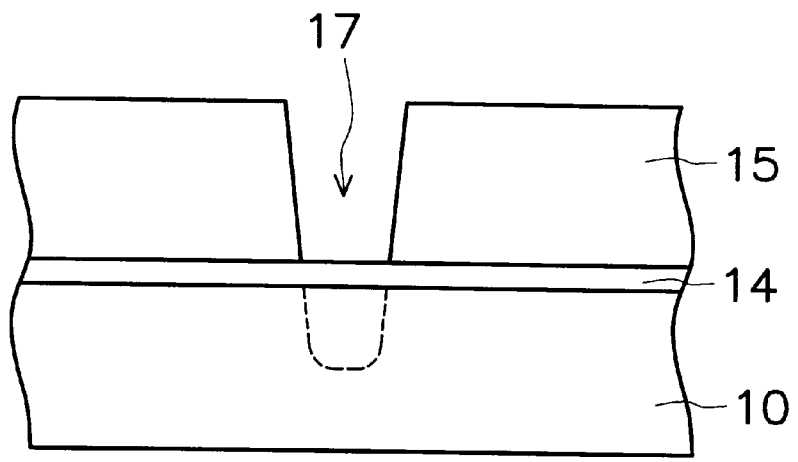
FIGS. 2A through 2D are schematic, cross-sectional views showing four different, defective contact holes formed by conventional methods.
Figure 2B:
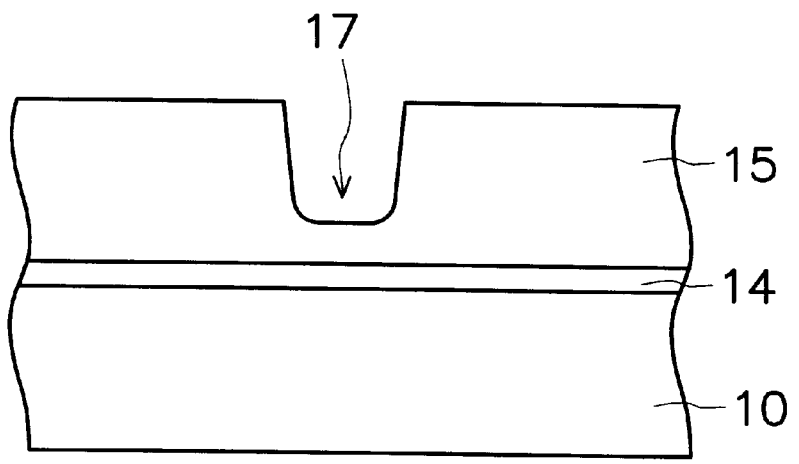
Figure 2C:
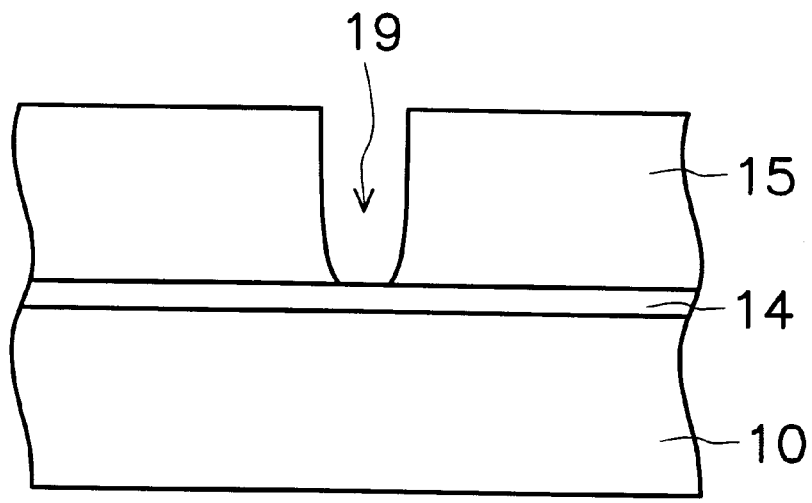
Figure 2D:
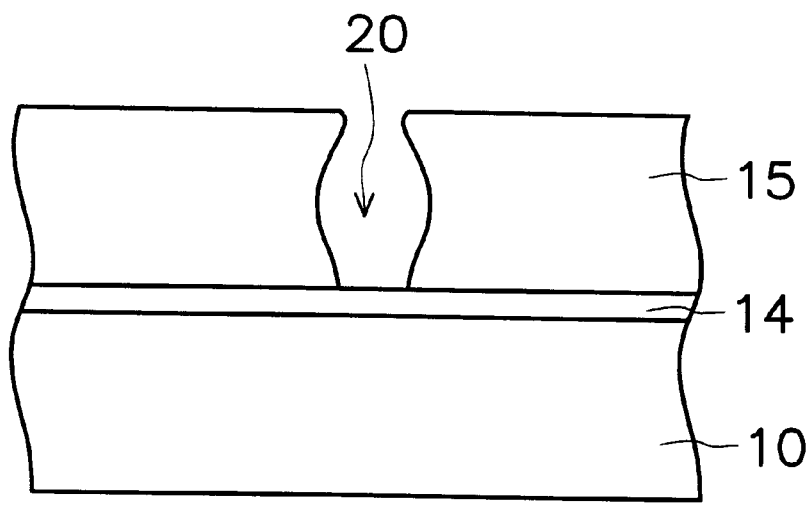
Figure 3A:
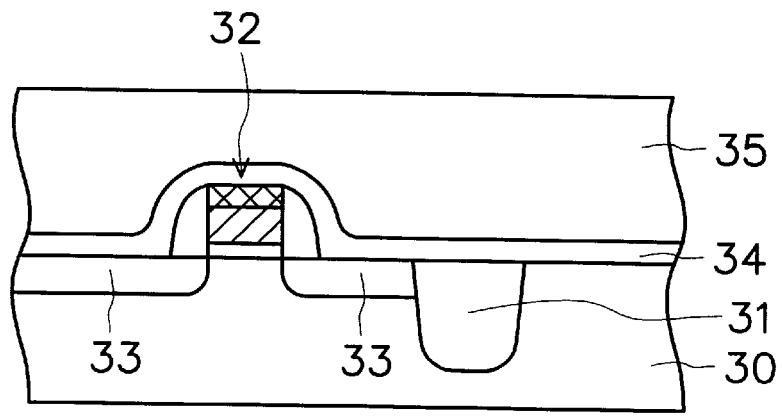
FIGS. 3A through 3C are schematic, cross-sectional views showing a method for forming a HAR borderless contact hole in a preferred embodiment according to the invention.
Figure 3B:
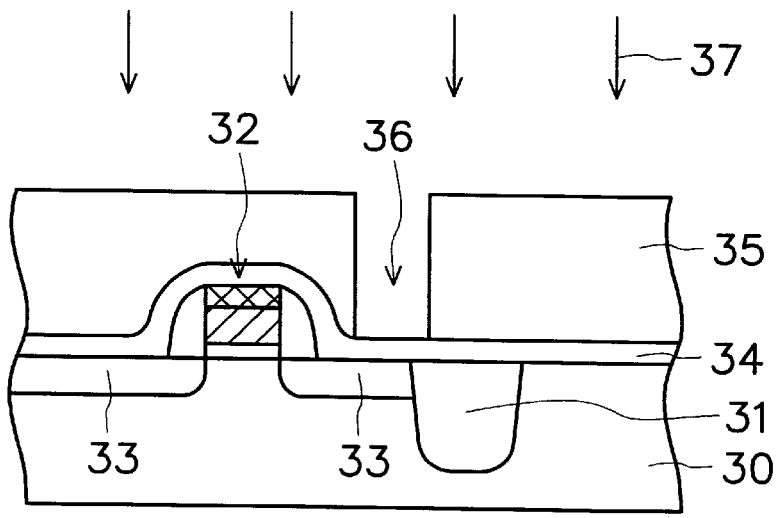
Figure 3C:
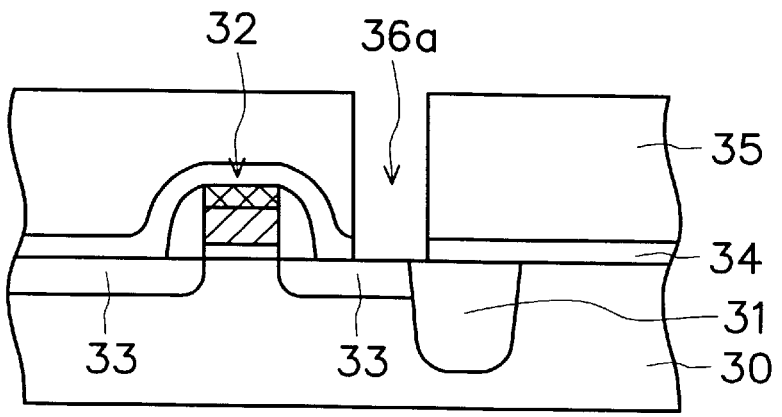

The invention provides a new method for forming a HAR (>4:1) borderless contact hole as shown in FIGS. 3A through 3C.

Referring to FIG. 3A, a provided substrate 30 contains at least an isolation structure 31, normally oxide, and a device, such as a metal-oxide-semiconductor (MOS) transistor. The MOS transistor contains a gate 32 and at least one source/drain region 33. By performing a process, such as low-pressure chemical vapor deposition (LPCVD) or PECVD, a silicon nitride layer 34 is formed to cover the foregoing substrate 30, the isolation structure 31 and the MOS transistor. The silicon nitride layer 34 is used as an etching end point in the follow-up etching process. Then, a silicon oxide layer 35, for example, LPCVD oxide, HDPCVD oxide, PSG or APTEOS, is deposited on the silicon nitride layer 34. The silicon oxide layer 35 isolates the MOS transistor from any subsequently formed devices.

Referring next to FIG. 3B, a patterned mask layer (not shown in figure) is formed on the silicon oxide layer by a conventional photolithography and etching process. Then, by applying a high-density-plasma, inductively coupled plasma (ICP) etcher together with a selected etchant, such as gaseous $C_4F_8/C_2F_6/Ar/CO$ or $C_4F_8/Ar/CO$, an etching process 37 is performed on the silicon oxide layer to form an opening 36.

The flow of $C_4F_8$ is controlled at about 10 to 20 sccm (standard cubic centimeter per minute), the flow of CO is controlled at about 1 to 100 sccm, and the flow of Ar is controlled at about 100 to 500 sccm. The flow of $C_2F_6$ is about 0.5 to 1.5 times that of $C_4F_8$. $C_4F_8$ and $C_2F_6$ gases provide carbon and fluorine, wherein carbon increases the deposition rate of polymer molecules for preserving the profile of the contact hole, and the fluorine ion increases the etching rate. Ar is used here to enhance the etching rate and to prevent the wall of the opening 36 from deposition with polymer molecules. CO is used to balance the amount of polymers deposited at bottom of the opening 36 during the etching process 37.

Figure 4:
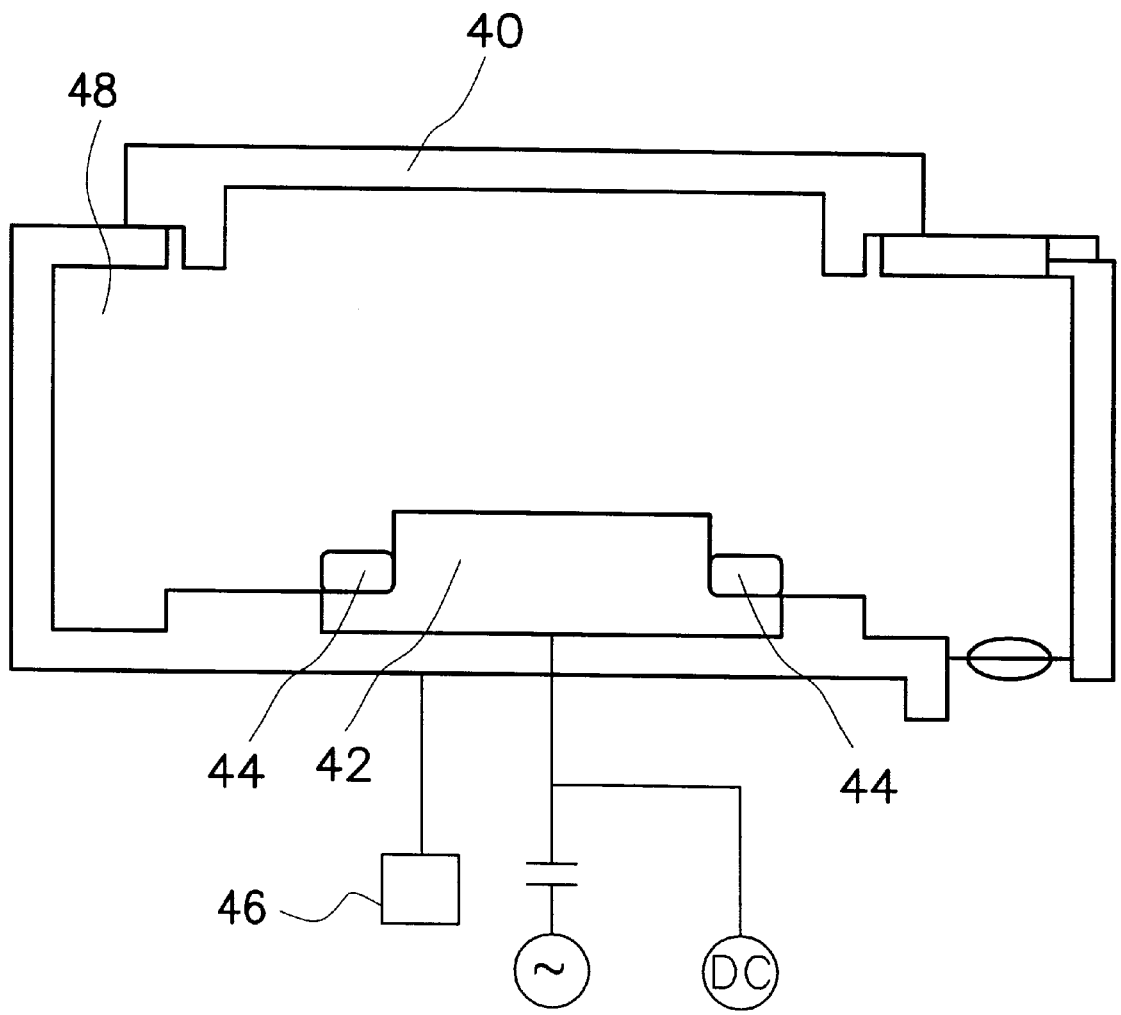
FIG. 4 is a schematic diagram showing the high plasma-density, inductively coupled plasma etcher used in the preferred embodiment of the invention.

As shown in FIG. 4, a high-density-plasma inductively coupled plasma etcher consists of a chamber 48, a roof 40, a ring 44 and a chiller 46, wherein the ring 44 sits on a stage 42.

While the etching process is performed within the chamber 48, preferably the temperature of the roof 40 is controlled at about 150 to 300°°C., the temperature of the chiller is controlled at about −20 to 20° C., the temperature of the ring 44 is controlled at about 150 to 400° C., and the wall temperature of the chamber is controlled at about 150 to 400° C. The pressure of the chamber 48 is controlled at about 4 to 50 mtorr. The bias of the ICP etcher is controlled at about 1000 to 2000 watts. The power of the ICP etcher is controlled at about 1500 to 3000 watts.

The process of the present invention achieves high oxide-to-nitride selectivity by using $C_4F_8$ gases with a high chamber wall temperature to generate carbon-rich polymers. The polymers deposited on the silicon oxide layer can be removed while the polymers deposited on the non silicon oxide layer cannot be removed in the etching process. The non silicon oxide layer includes silicon nitride, tungsten silicide, titanium silicide, aluminum, etc. Therefore, the etching process 37 can be stopped by using the silicon nitride layer 34 as an etching end point. By operating at a low chamber pressure and using lower wall polymer deposition conditions with high Ar flow, a vertical profile of nearly 90 degrees (>89 degrees) can be achieved without sacrificing the oxide to nitride selectivity. The etch-stop depth window can be improved by adding a different amount of CO. With proper adjustments of $C_4F_8$ flow rate, $C_4F_8$ to $C_2F_6$ flow ratio, CO flow rate, Ar flow rate, chamber wall temperature, and other process parameters, an oxide-to-nitride selectivity of about 20:1 can be obtained. In the mean time, a vertical profile of nearly 90 degrees (>89 degrees) is achieved, as well.

Referring to FIG. 3C, after the opening 36, which exposes the silicon nitride layer 34 underneath the silicon oxide layer 35, is formed, the exposed portion of the silicon nitride layer 34 is also removed to form a contact hole 36a that exposes the source/drain region 33. A follow-up process, such as metallization, is performed to form a plug within the opening. This process is well known by people skilled in this art, and there is no further description of it.

The opening formed by the method of the invention in this preferred embodiment exposes a portion of a source/drain region, wherein the opening serves as a contact hole. The method of the invention can also be used to form an opening that exposes a portion of a conductive layer, wherein the opening serves as a via hole.

In accordance with the foregoing, the method of the invention has the following advantages:

1. The method of the invention is able to achieve both a high oxide-to-nitride selectivity, a vertical-profile opening, and a high oxide etch rate for HAR borderless contact etch by operating a high-density-plasma inductively coupled plasma etcher with a selected etchant, $C_4F_8/C_2F_6/Ar/CO$ or $C_4F_8/Ar/CO$, under properly determined conditions; and
2. The method of the invention is able to preserve the profile of the opening, which directly relates to the etching rate of the etching process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a HAR (>4:1) contact hole to expose a portion of a substrate in a silicon oxide layer by performing an etching process on an etcher containing a roof, a ring, a chiller and a chamber, the method comprising the steps of:

forming a silicon nitride layer on the substrate, wherein the silicon nitride layer serves as an etching end point;

forming a silicon oxide layer on the silicon nitride layer;

performing a plasma etching process in the chamber to form an opening in the silicon oxide layer to expose a portion of the silicon nitride layer underneath by using an etchant, wherein the etchant consists of gaseous $C_4F_8/C_2F_6/Ar/CO$, and wherein the etchant works under conditions of:

a $C_4F_8$ flow controlled at about 10 to 20 sccm;
an Ar flow controlled at about 100 to 500 sccm;
a CO flow controlled at about 1 to 100 sccm;
a $C_2F_6$ flow that is about 0.5 to 1.5 times that of $C_4F_8$;
a roof temperature controlled at about 150 to 300° C.;
a wall temperature of the chamber controlled at about 150 to 400° C.;
a ring temperature controlled at about 150 to 400° C.;
a chiller temperature controlled at about −20 to 20° C.;
a pressure within the chamber controlled at about 4 to 50 mtorr;
an etcher bias controlled at about 1000 to 2000 watts; and
an etcher power controlled at about 1500 to 3000 watts; and removing the exposed portion of the silicon nitride layer to expose a portion of the substrate underneath the exposed portion of the silicon nitride layer.

2. An etching environment for performing an etching process on a silicon oxide layer while a silicon nitride layer is used as an etching end point, wherein the etching process is performed within an etcher containing a roof, a ring, a chiller and a chamber with an etchant, and the etchant includes of gaseous $C_4F_8/C_2F_6/Ar/CO$, the etching environment comprising conditions of:

- a $C_4F_8$ flow controlled at about 10 to 20 sccm;
- an Ar flow controlled at about 100 to 500 sccm;
- a CO flow controlled at about 1 to 100 sccm;
- a $C_2F_6$ flow that is about 0.5 to 1.5 times that of $C_4F_8$;
- a roof temperature controlled at about 150 to 300° C.;
- a wall temperature of the chamber controlled at about 150 to 400° C.;
- a ring temperature controlled at about 150 to 400° C.;
- a chiller temperature controlled at about −20 to 20° C.;
- a pressure within the chamber controlled at about 4 to 50 mtorr; and
- an etcher bias controlled at about 2000 to 2000 watts;
- an etcher power controlled at about 1500 to 3000 watts.

3. A method for forming a via hole to expose a portion of a substrate in a silicon oxide layer by performing an etching process on an etcher containing a roof, a ring, a chiller and a chamber, the method comprising the steps of:

- forming a silicon nitride layer on the substrate, wherein the silicon nitride layer serves as an etching end point;
- forming a silicon oxide layer on the silicon nitride layer;
- performing a plasma etching process in the chamber to form an opening in the silicon oxide layer to expose a portion of the silicon nitride layer underneath by using an etchant, wherein the etchant consists of gaseous $C_4F_8/C_2F_6/Ar/CO$, and wherein the etchant works under conditions of:
  - a $C_4F_8$ flow controlled at about 10 to 20 sccm;
  - an Ar flow controlled at about 100 to 500 sccm;
  - a CO flow controlled at about 1 to 100 sccm;
  - a $C_2F_6$ flow that is about 0.5 to 1.5 times that of $C_4F_8$;
  - a roof temperature controlled at about 150 to 300° C.;
  - a wall temperature of the chamber controlled at about 150 to 400° C.;
  - a ring temperature controlled at about 150 to 400° C.;
  - a chiller temperature controlled at about −20 to 20° C.;
  - a chamber pressure within the chamber controlled at about 4 to 50 mtorr;
  - an etcher bias controlled at about 1000 to 2000 watts; and
  - an etcher power controlled at about 1500 to 3000 watts; and
- removing the exposed portion of the silicon nitride layer to expose a portion of the substrate underneath the exposed portion of the silicon nitride layer.

4. A method for forming a HAR (>4:1)contact hole to expose a portion of a substrate in a silicon oxide layer by performing an etching process on an etcher containing a roof, a ring, a chiller and a chamber, the method comprising the steps of:

- forming a silicon nitride layer on the substrate, wherein the silicon nitride layer serves as an etching end point;
- forming a silicon oxide layer on the silicon nitride layer;
- performing a plasma etching process in the chamber to form an opening in the silicon oxide layer to expose a portion of the silicon nitride layer underneath by using an etchant, wherein the etchant consists of gaseous $C_4F_8/Ar/CO$, and wherein the etchant works under conditions of:
  - a $C_4F_8$ flow controlled at about 10 to 20 sccm;
  - an Ar flow controlled at about 100 to 500 sccm;
  - a CO flow controlled at about 1 to 100 sccm;
  - a roof temperature controlled at about 150 to 300° C.;
  - a wall temperature of the chamber controlled at about 150 to 400° C.;
  - a ring temperature controlled at about 150 to 400° C.;
  - a chiller temperature controlled at about −20 to 20° C.;
  - a pressure within the chamber controlled at about 4 to 50 mtorr;
  - an etcher bias controlled at about 1000 to 2000 watts; and
  - an etcher power controlled at about 1500 to 3000 watts; and
- removing the exposed portion of the silicon nitride layer to expose a portion of the substrate underneath the exposed portion of the silicon nitride layer.

5. An etching environment for performing an etching process on a silicon oxide layer while a silicon nitride layer is used as an etching end point, wherein the etching process is performed within an etcher containing a roof, a ring, a chiller and a chamber with an etchant, and the etchant includes of gaseous $C_4F_8/Ar/CO$, the etching environment comprising conditions of:

- a $C_4F_8$ flow controlled at about 10 to 20 sccm;
- an Ar flow controlled at about 100 to 500 sccm;
- a CO flow controlled at about 1 to 100 sccm;
- a roof temperature controlled at about 150 to 300° C.;
- a wall temperature of the chamber controlled at about 150 to 400° C.;
- a ring temperature controlled at about 150 to 400° C.;
- a chiller temperature controlled at about −20 to 20° C.;
- a pressure within the chamber controlled at about 4 to 50 mtorr; and
- an etcher bias controlled at about 1000 to 2000 watts;
- an etcher power controlled at about 1500 to 3000 watts.

6. A method for forming a via hole to expose a portion of a substrate in a silicon oxide layer by performing an etching process on an etcher containing a roof, a ring, a chiller and a chamber, the method comprising the steps of:

- forming a silicon nitride layer on the substrate, wherein the silicon nitride layer serves as an etching end point;
- forming a silicon oxide layer on the silicon nitride layer;
- performing a plasma etching process in the chamber to form an opening in the silicon oxide layer to expose a portion of the silicon nitride layer underneath by using an etchant, wherein the etchant consists of gaseous $C_4F_8/Ar/CO$, and wherein the etchant works under conditions of:
  - $C_4F_8$ flow controlled at about 10 to 20 sccm;
  - an Ar flow controlled at about 100 to 500 sccm;
  - a CO flow controlled at about 1 to 100 sccm;
  - a roof temperature controlled at about 150 to 300° C.;
  - a wall temperature of the chamber controlled at about 150 to 400° C.;
  - a ring temperature controlled at about 150 to 400° C.;
  - a chiller temperature controlled at about −20 to 20° C.;
  - a chamber pressure within the chamber controlled at about 4 to 50 mtorr;
  - an etcher bias controlled at about 1000 to 2000 watts; and an etcher power controlled at about 1500 to 3000 watts; and
- removing the exposed portion of the silicon nitride layer to expose a portion of the substrate underneath the exposed portion of the silicon nitride layer.

* * * * *